United States Patent [19]

Kawamura et al.

[11] Patent Number: 5,562,800
[45] Date of Patent: Oct. 8, 1996

[54] WAFER TRANSPORT METHOD

[75] Inventors: Yoshio Kawamura, Kokubunji; Yoshifumi Kawamoto, Kanagawa-ken; Fumihiko Uchida; Kenichi Mizuishi, both of Hachioji; Natsuki Yokoyama, Mitaka; Eiichi Murakami, Tokorozawa; Yoshinori Nakayama, Sayama; Eiichi Seya, Hachioji, all of Japan

[73] Assignee: Hitachi, Ltd., Tokyo, Japan

[21] Appl. No.: 308,442

[22] Filed: Sep. 19, 1994

[30] Foreign Application Priority Data

Sep. 20, 1993 [JP] Japan .................................. 5-233065

[51] Int. Cl.⁶ .................................................. H01L 21/00
[52] U.S. Cl. .................................... 156/643.1; 156/345
[58] Field of Search .......................... 156/345 P, 643.1, 156/657.1, 662.1, 646.1

[56] References Cited

U.S. PATENT DOCUMENTS 4,477,311 10/1984 Mimura et al. ..................... 156/345 X
4,587,002 5/1986 Bok ...................................... 156/345 X

FOREIGN PATENT DOCUMENTS

51-131461 11/1976 Japan .
62-147726 7/1987 Japan .
4-63414 2/1992 Japan .

*Primary Examiner*—William Powell
*Attorney, Agent, or Firm*—Fay, Sharpe, Beall, Fagan, Minnich & McKee

[57] ABSTRACT

A wafer transport method includes the steps of preparing a semiconductor process equipment having a transport chamber and a process chamber. An interface means connects the transport chamber to the process chamber. A transport means transports a semiconductor wafer from the transport chamber to the process chamber by way of the interface means. The transport means mounting a substrate is inserted into a communicating corridor including a supply means and an exhaust means. The substrate is transported while performing the supply and exhaust by sequentially controlling a supply shutoff means, an exhaust shutoff means, and a communicating shutoff means according to the position of a conductance part formed of a gap between the transport means and the communicating corridor. Thus, the substrate is transported at a high throughput without contamination of the substrate while keeping the different atmospheric conditions for the transport chamber and the process chamber, thereby manufacturing a semiconductor device with high performance capabilities.

21 Claims, 5 Drawing Sheets

WAFER TRANSPORT METHOD

BACKGROUND OF THE INVENTION

The present invention relates to a wafer transport method, and particularly to a wafer transport method which is used in a semiconductor process equipment having a process chamber and a transport chamber.

A through process equipment for semiconductor devices has been known, for example in Unexamined Japanese Patent Publication No. HEI 4-63414, wherein a plurality of process chambers for cleaning, deposition, etching, exposure of latent image are disposed around a transport chamber for preventing the contamination of a wafer surface thereby improving the performance of a semiconductor device. A means of transporting a substrate between different atmospheres has been also described in Unexamined Japanese Patent Publication No. SHO 62-147726, wherein a substrate is transported by moving a holder mounting the substrate by way of a communicating corridor, a prior exhaust chamber, and the communicating corridor.

In the above-described prior art references, the through process equipment requires partitioning each process chamber from a transport chamber by means of a gate valve, and adjusting an atmospheric pressure in each process chamber and opening/closing the gate valve connected to the transport chamber for each wafer transport, thereby causing a disadvantage in lowering the throughput. The method of transporting a substrate while keeping the conditions of the process chambers with different atmospheres is disadvantageous in that an atmospheric gas flows in the prior exhaust chamber from each process chamber and a transport chamber by way of a gap formed between the communicating corridor and the holder, thereby contaminating a substrate mounted on the holder.

SUMMARY OF THE INVENTION

The present invention overcomes above-described problems, and an object of the present invention is to provide a wafer transport method with a high throughput which is capable of transporting a substrate between a transport chamber and a process chamber which have different atmospheres while keeping the different atmospheric conditions of both the chambers for reducing the contamination of the substrate.

The above object can be achieved, according to the present invention, by provision of a wafer transport method including the steps of:

preparing a semiconductor process equipment, the equipment including a process chamber, a transport chamber for transporting a semiconductor wafer to the process chamber, an interface means disposed between the process chamber and the transport chamber, and a transport means for transporting the wafer from the transport chamber to the process chamber by way of the interface means, wherein the interface means is provided with a communicating corridor capable of inserting and pushing the transport means from the side of the transport chamber for allowing the transport means to penetrate into the process chamber;

inserting the transport means mounting the wafer into the communicating corridor, and when the leading edge of the transport means is positioned in front of the opening of a first supply means connected to the communicating corridor, starting the supply of a first gas from the first supply means into the communicating corridor;

increasing the insertion amount of the transport means in the communicating corridor, and when the leading edge of the transport means passes through the opening of the first supply means, starting the exhaust of the gas in the communicating corridor by an exhaust means connected to the communicating corridor while continuing the supply of the first gas;

further increasing the insertion amount of the transport means in the communicating corridor, and when the leading edge of the transport means passes through the opening of the exhaust means, starting the supply of a second gas from a second supply means connected to the communicating corridor into the communicating corridor while continuing the supply of the first gas and also continuing the exhaust by the exhaust means;

further increasing the insertion amount of the transport means into the communicating corridor, and when the leading edge of the transport means passes through the opening of the second supply means, opening the space between the communicating corridor and the process chamber which is shut-off by a shutoff means while continuing the supply of the first and second gases and also continuing the exhaust by the exhaust means; and further increasing the insertion amount of the transport means into the communicating corridor, thereby transporting the wafer into the process chamber.

The process chamber preferably performs at least one surface treatment selected from a group consisting of an etching process, a cleaning process, an ashing process, a thin film deposition process, a lithography process, an electron beam lithography process and a surface measurement process. Preferably, the transport means has a bar-like shape, and the sectional shape of the transport means at its portion inserted in the communicating corridor is substantially analogous to the sectional shape of the communicating corridor. A gap between the communicating corridor and the transport means inserted in the communicating corridor is preferably kept small, so that the gap forms a small conductance part. For example, by setting the gap formed between the wall surface of the communicating corridor and the wall surface of the transport means at a finite value of 100 µm or less, the small conductance part can be formed. Moreover, a stage of wafer may be provided at a front portion of the transport means.

Preferably, the first gas is the same in quality or kind as the gas in the transport chamber and the gas pressure of the first gas is higher than that of the gas in the transport chamber; and the second gas is the same in quality or kind as the gas in the process chamber, and the gas pressure of the second gas is higher than that of the gas in the process chamber. Moreover, the pressure in the process chamber is higher or lower than that in the transport chamber.

In this semiconductor process equipment, there may be provided a plurality of process chambers and a plurality of interface means for one transport chamber. In this case, each interface means may be provided between the transport chamber and each process chamber.

The above wafer transport method may further includes the steps of:

mounting the wafer from a stage means in the process chamber onto the transport means which is inserted in the communicating corridor and is introduced at the leading edge in the process chamber;

retreating the transport means, and when the end portion of the transport means is retreated behind the position of the shutoff means, shutting-off the space between the communicating corridor and the process chamber by the shutoff means;

further retreating the transport means, and when the end portion of the-transport is retreated behind the position of the second supply means, stopping the supply of the second gas from the second supply means; and further retreating the transport means, and when the end portion of the transport means is retreated behind the position of the first supply means, stopping the supply of the first gas from the first supply means.

The above object can be also achieved, according to the present invention, by provision of a wafer transport method including the steps of:

preparing a semiconductor process equipment, the equipment including a process chamber for applying a surface treatment to a semiconductor wafer, a transport chamber for transporting the wafer to the process chamber, an interface means disposed between the process chamber and the transport chamber, and a transport means for transporting the wafer from the transport chamber to the process chamber by way of the interface means, wherein the transport means has a stage of wafer at the front portion thereof, the interface means is provided with a communicating corridor having the sectional shape being substantially analogous to that of the transport means so that the wafer can be transported in the process chamber by inserting and pushing the transport means mounting the wafer from the side of the transport chamber, a gap between the communicating corridor and the transport means inserted in the communicating corridor is kept to be small so that it forms a small conductance part, a first supply means is connected to the communicating corridor on the side near the transport chamber, a second supply means is connected to the communicating corridor on the side near the process chamber, an exhaust means connected to the communicating corridor is provided between the first supply means and the second supply means, and a shutoff means for shut-off of the communicating corridor is provided in the communicating corridor near the end portion thereof on the side of the process chamber;

shutting-off the communicating corridor by the shutoff means, and inserting the transport means mounting the wafer from the side of the transport chamber in such a state that the supply of gases from the first and second supply means is stopped and the exhaust function of the exhaust means is stopped;

increasing the insertion amount of the transport means in the communicating corridor, and when the leading edge of the transport means is positioned in front of the opening of the first supply means, starting the supply of a first gas being the same in quality or kind as the gas in the transport chamber to the communicating corridor from the first supply means;

further increasing the insertion amount of the transport means in the communicating corridor, and when the leading edge of the transport means passes through the opening of the first supply means, starting the exhaust in the communicating corridor by the exhaust means while continuing the supply of the first gas;

further increasing the insertion amount of the transport means in the communicating corridor, and when the leading edge of the transport means passes through the opening of the exhaust means, starting the supply of a second gas being the same in quality or kind as the gas in the process chamber to the communicating corridor from the second supply means while continuing the supply of the first gas and also continuing the exhaust by the exhaust means;

further increasing the insertion amount of the transport means in the communicating corridor, and when the leading edge of the transport means passes through the opening of the second supply means, opening the communicating corridor which is shut-off by said shutoff means while continuing the supply of the first and second gases and also continuing the exhaust by the exhaust means; and further increasing the insertion amount of the transport means in the communicating corridor in such a state, thereby transporting the wafer in the process chamber.

In this method, a plurality of exhaust means may be provided, and which may be disposed between the first supply means and second supply means.

The above object can be further achieved, according to the present invention, by provision of a wafer transport method including the steps of:

preparing a semiconductor process equipment, the equipment including a process chamber for applying a surface treatment to a semiconductor wafer, a transport chamber for transporting the wafer to the process chamber, an interface means disposed between the process chamber and the transport chamber, and a first transport means and a second transport means for transporting the wafer from the transport chamber to the process chamber by way of the interface means, wherein a connecting means for connecting the first transport means to the second transport means is provided at one end of the first transport means, a shutoff means for shut-off of the end portion of the communicating corridor on the side of the process chamber is provided on the other end of the first transport means, a holding means for holding the wafer is provided on the second transport means on the side to be connected to the first transport means, an interface means is provided with a communicating corridor having the sectional shape being substantially analogous to that of the first and second transport means so that the wafer can be transported in the process chamber by inserting and pushing the first transport means and the second transport means mounting the wafer from the side of the transport chamber, a gap between the communicating corridor and the first and second transport means inserted in the communicating corridor is kept to be small so that it forms a small conductance part, a first supply means is connected to the communicating corridor on the side near the transport chamber, a second supply means is connected to the communicating means on the side near the process chamber, and an exhaust means connected to the communicating corridor is provided between the first supply means and the second supply means;

inserting the first transport means in the communicating corridor and shutting-off the communicating corridor by the shutoff means, starting the exhaust in the communicating corridor by the exhaust means, starting the supply of a first gas being substantially the same in quality and kind as that in the transport chamber to the communicating corridor from the first supply means, and starting the supply of a second gas being substantially the same in quality or kind as that in the process chamber to the communicating corridor from the second supply means;

inserting the second transport means mounting the wafer from the side of the transport chamber and connecting the second transport means to the first transport means by the connecting means; and further increasing the insertion amount of the second transport means in the communicating corridor in such a state thereby transporting the wafer in the process chamber.

In this method, preferably, the wafer is mounted on the second transport means in such a state that the first transport means is connected to the second transport means, and that the portion of the second transport means mounting the wafer is transported in the process chamber;

the first and second transport means are retreated and the end portion of the communicating corridor on the side of the process chamber is shut-off by the shutoff means; and the second transport means is further retreated and the connection between the first transport means and the second transport means is released, the supply of the second gas from the second supply means is stopped, and the exhaust by the exhaust means is stopped.

In this method, the supply means are independently provided on the inlet side and the outlet side of the communicating corridor for connecting the transport chamber to the process chamber. Of these supply means, from one provided on the inlet side, the first gas being the same in quality or kind as the gas supplied to the transport chamber is supplied to the communicating corridor by way of a specified filter means at a pressure slightly higher than that in the transport chamber. Meanwhile, from one provided on the outlet side, the second gas being the same in quality or kind as the gas supplied to the process chamber is supplied to the communicating corridor by way of a specified means filter means at a pressure slightly higher than that of the process chamber. In this case, the first gas and second gas can be allowed to flow on the transport chamber side and the process chamber side respectively by way of the conductance part formed of the gap between the inner wall of the communicating corridor and the outer wall of the transport means inserted in the communicating corridor, so that the gases containing contaminated substances in the transport chamber and the process chamber are never entrapped in the gap formed between the inner wall of the communicating corridor and the outer wall of the transport means, thus making it possible to prevent the contamination of the substrate mounted on the transport means.

When the transport means is not inserted into the communicating corridor and the conductance part by the inner wall of the communicating corridor and the outer wall of the transport means is not formed, the shutoff means are all closed. As the transport means is inserted in the communicating corridor and the conductance part is positioned directly before the supply space of the supply means or the exhaust space of the exhaust means, the supply shutoff means of the supply means or the exhaust shutoff means of the exhaust means near the position of the conductance part is opened. Moreover, in the case that the transport means is drawn from the communicating corridor, it is drawn into the transport chamber while the shutoff means of the supply means and the exhaust means are closed in the manner reversed to the above insertion procedure.

According to the present invention, the small conductance part formed of a gap between the inner wall of the communicating corridor and the outer wall of the transport means is sequentially moved in the communicating corridor, and the supply space and exhaust space are controlled to be shut-off or opened according to the movement of the conductance part, so that it becomes possible to smoothly transport the substrate without any entrapment of the gases between the transport chamber and the process chamber which are adjacent to each other and have different atmospheric conditions. As a result, the substrate is not contaminated, thus making it possible to manufacture a semiconductor device having a high performance at a high throughput.

DETAILED DESCRIPTION OF THE PREFERRED EMBODIMENTS

Hereinafter, a first embodiment of the present invention will be described with reference to FIG. 1, FIGS. 2a to 2e, and FIGS. 3a and 3b. In these figures, the same parts are designated at the same numerals.

Figure 1:
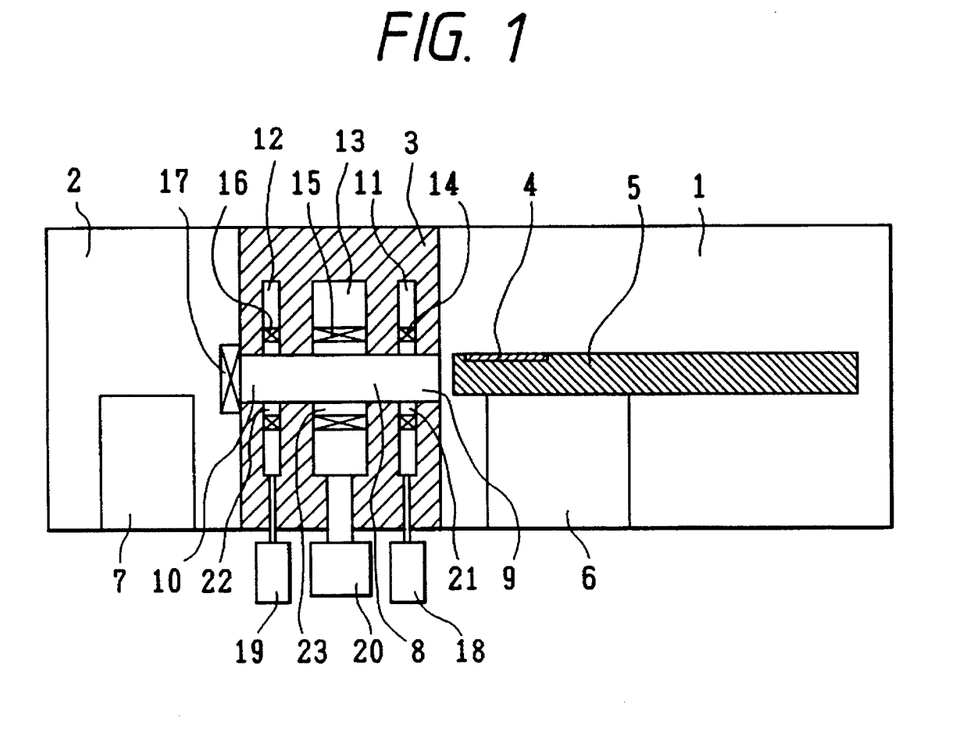
FIG. 1 is a schematic sectional view of a semiconductor process equipment used in a first embodiment of the present invention.

FIG. 1 is a schematic sectional view of a semiconductor process equipment used in the first embodiment of the present invention; FIGS. 2a to 2e are schematic sectional views of the semiconductor process equipment showing the procedure of the first embodiment of the present invention; and FIGS. 3a and 3b are partial schematic perspective views of the semiconductor process equipment for explaining the first embodiment of the present invention.

A semiconductor process equipment of the present invention mainly includes a transport chamber 1, a process chamber 2 and an interface means 3.

The transport chamber 1 includes a transfer means 5 for mounting and transporting a substrate 1, a drive means 6 for driving the transfer means 5, and an atmosphere control means (not shown) for keeping the atmospheric condition in the transfer chamber 1. The process chamber 2 includes a stage means 7 for mounting the substrate 4, a process means (not shown) for applying a specified process to the substrate 4, and an atmospheric control means (not shown) for keeping the atmospheric condition in the process chamber 2. The interface means 3 includes a communicating corridor 8 for connecting the transport chamber 1 to the process chamber 2. In this communicating corridor 8, supply means 11 and 12 are provided near a communicating corridor inlet 9 and a communicating corridor outlet 10 respectively, and one or more exhaust means 13 (one, in the figure) are provided between these supply means 11 and 12.

The sectional shape of the passage surrounded by the internal wall of the communicating corridor is slightly larger than and analogous to the sectional shape formed by the outermost wall surface of the transfer means 5. The gap between the opposed wall surfaces of the above communicating means 5 and the transfer means 5 is set such that it becomes 100 µm or less when the transfer means 5 is inserted in the communicating corridor 8. A small conductance part is thus formed of this gap. The gap may be set at a finite value, and preferably at a value of 5 µm or more. Supply spaces 21 and 22 connected to the supply means, and an exhaust space 23 connected to the exhaust means which is disposed at the position surrounded by the supply spaces, are provided in the inner wall of the communicating corridor 8 in such a manner as to surround the transfer means 5. Supply shutoff means 14 and 16, and an exhaust shutoff means 15 are provided in the supply spaces 21 and 22 and the exhaust space 23, respectively, each of which is disposed at such a position that the internal capacity of the supply space or exhaust space between the shutoff means and the communicating corridor 8 is made as small as possible. A communicating corridor outlet shutoff means 17 is provided at a communicating corridor outlet 10.

A gas supply system 18 for supplying a first gas which is the same in kind as the gas supplied to the transport chamber 1 is provided at the other end of the supply means 11 by way of a flow rate control means (not shown) and a filter means (not shown). Similarly, a gas supply system 19 for supplying a second gas which is the same in kind as the gas supplied to the process chamber 2 is provided at the other end of the supply means 12 by way of a flow rate control means (not shown) and a filter means (not shown). These gases may be suitably selected according to the purpose of processing. The other end of the exhaust means 13 is connected to the exhaust system 20.

A substrate 4 is transferred from a load-lock chamber (not shown) to the transfer means 5. In addition, the substrate 4 on the transfer means 5 may be transported to another process chamber (not shown) by way of the transport chamber 1. The connection between the transport chamber 1 and the above load-lock chamber or another process chamber disposed around the transport chamber 1 may be performed by use of the same mechanism as the above interface means 3.

The procedure of transporting a substrate will be described below with reference to FIGS. 2a to 2e.

First, when the whole transfer means 5 is drawn in the transport chamber 1, the supply shutoff means 14 and 16, the exhaust shutoff means 15, and the communicating corridor outlet shutoff means 17 are all closed. Next, as the transfer means 5 is inserted from the transport chamber 1 into the communicating corridor inlet 9, a conductance part 30, which is constituted of a gap of 100 µm or less between the inner wall surface of the communicating corridor 8 and the outer wall of the transfer means 5, is formed in the communicating corridor 8. When the conductance part 30 is positioned at the communicating inlet 9, the supply shutoff means 14 is opened to supply a first gas from the supply means 11 to the supply space 21 (see FIG. 2a). After the transfer means 5 is gradually moved and the leading edge thereof passes through the supply space 21, that is, when the conductance part 31 is positioned at the inlet side of the exhaust means 13, the exhaust shutoff means 15 is opened to exhaust the gas in the exhaust space 23 and the communicating corridor 8. In addition, the volumes of the exhaust space 23 and the communicating corridor 8 are small, so that the exhaust can be sufficiently performed while the transfer means 5 is moved at a constant speed (see FIG. 2b). When the transfer means 5 is further moved and the leading edge thereof passes through the exhaust space 23, that is, when the conductance part 32 is positioned directly before the supply means 12 on the outlet side of the communicating corridor 8, the supply shutoff means 16 is opened to supply a second gas to the supply space 22 and the communicating corridor 8 (see FIG. 2c). After the transfer means is further moved and the conductance part 33 passes through the supply space 22, the communicating corridor outlet shutoff means 17 is opened (see FIG. 2d). After that, the transfer means 5 is inserted in the process chamber 2, and the substrate 4 is replaced by the already processed substrate (not shown) directly over the stage means 6 using a load-unload means (not shown) (see FIG. 2e).

Figure 2A:
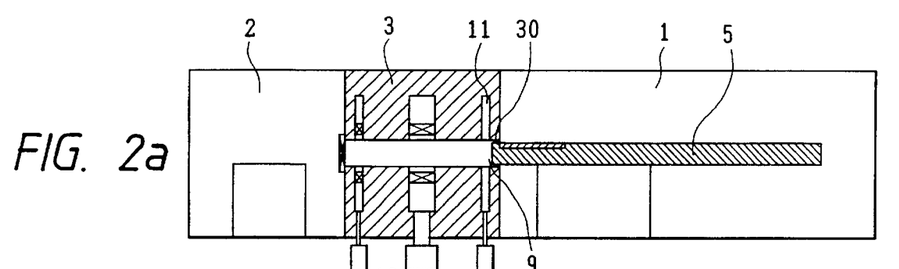
FIGS. 2a to 2e are schematic sectional views of the semiconductor process equipment showing the procedure of the first embodiment of the present invention.
Figure 2B:
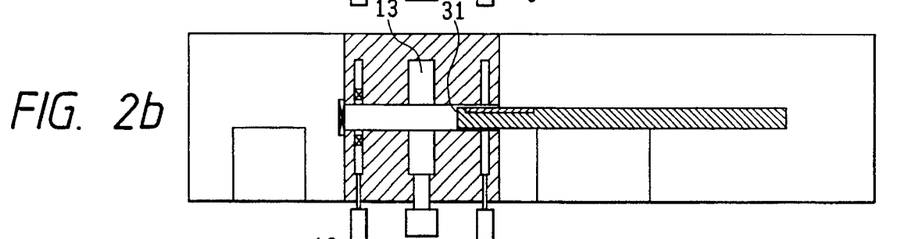
Figure 2C:
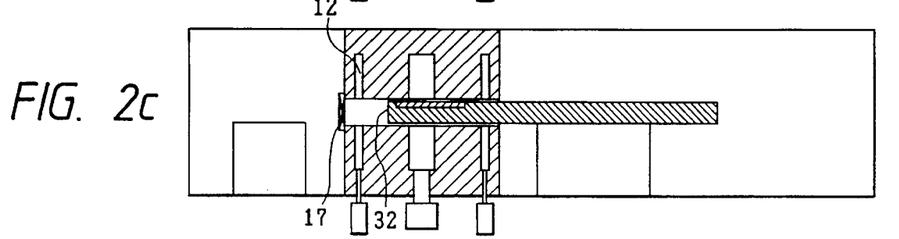
Figure 2D:
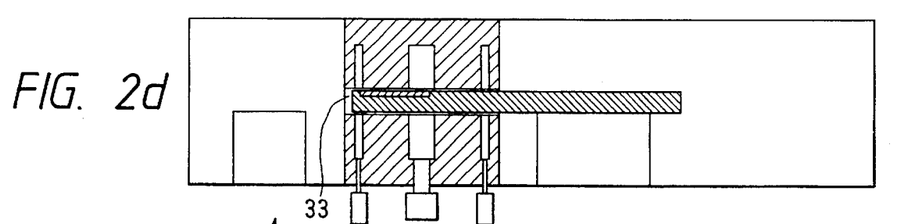
Figure 2E:
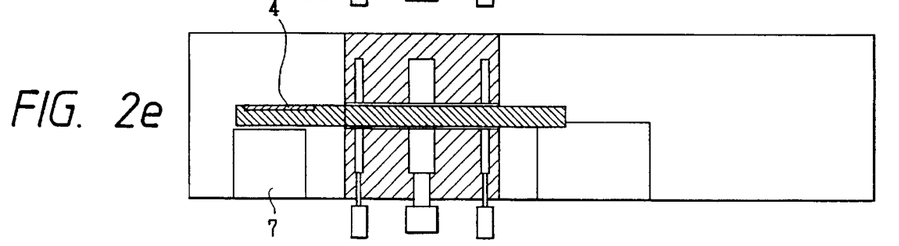
Figure 3A:
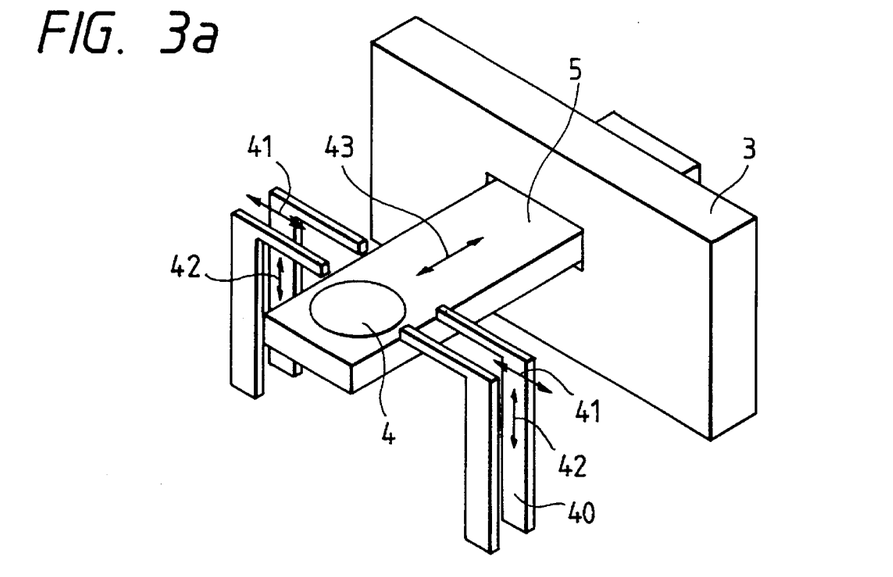
FIGS. 3a to 3b are partially schematic perspective views of the semiconductor process equipment used in the first embodiment of the present invention.
Figure 3B:
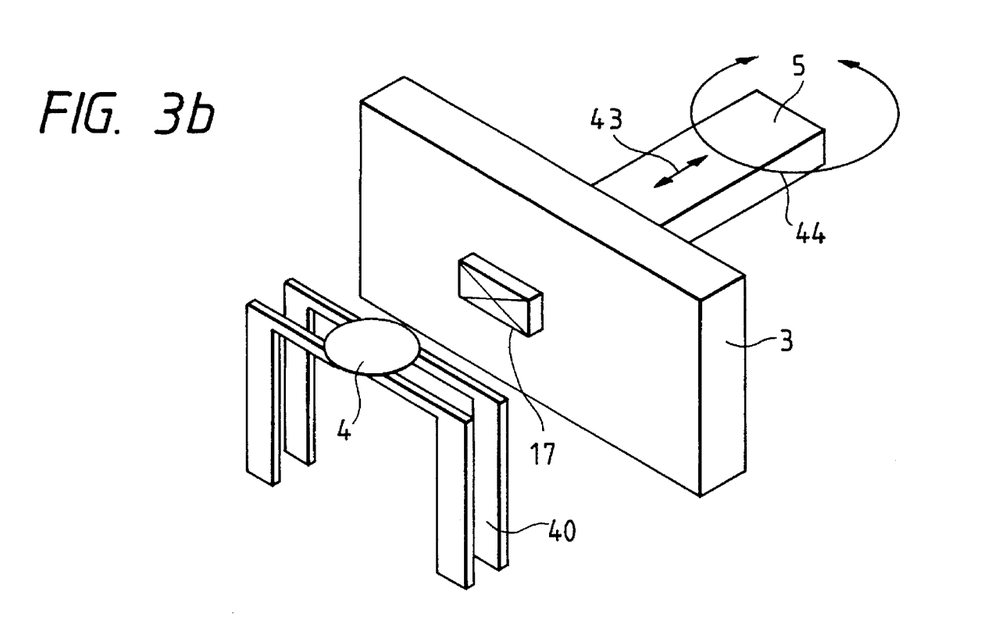

The already processed substrate 4, which has been replaced in the process chamber 2, can be transported from the process chamber to the transport chamber 1 according to the manner reversed to the above-described procedure, wherein the substrate 4 shown in FIG. 2e is substituted for the already processed substrate. After being unloaded to the transport chamber 1, the already processed substrate 4 is inserted and transported into another process chamber as needed, or transported into the load-lock chamber.

FIGS. 3a and 3b are partial schematic perspective views of the semiconductor process equipment. The right and upper side from the interface means 3 is equivalent to a transport chamber, and the left and lower side thereof is equivalent to a process chamber. The transfer of a substrate to a load-unload means 40 in the process chamber will be described with reference to this figure. To receive the substrate 4 transported in the process chamber in the direction of the arrow 43 by means of the transfer means 5, the load-unload means 40 is lifted in the direction of the arrow 42 and moved in the direction of the arrow 41 (see FIG. 3a). After the substrate is mounted on the load-unload means 40, the transfer means 5 is returned on the side of the transport chamber and the shutoff means 17 is closed (FIG. 3b). The substrate mounted on the load-unload means 40 is shifted on the stage means (not shown) in the process chamber, and is then subjected to a specified process. The substrate thus processed is transported to the transport chamber according to the above-described transport method.

As the first gas supplied into the transport chamber, nitrogen having a high purity of 99.99% or more is used. As the second gas supplied into the process chamber, when it is used for etching of the substrate 4, fluorine based gas such as $CF_4$, $CHF_3$ or $SF_6$, chlorine based gas such as $CCl_4$, or a mixture gas of the above gas added with oxygen at a specified composition is used.

In another process chamber (not shown), there may be performed a dry cleaning process using plasma gas, an ashing cleaning process by irradiation of shortwave light, a cleaning process by the supply of chlorine gas and irradiation of shortwave light, a thin film deposition process using a chemically vaporized gas, a lithography process for reduction projection of a mask pattern using ultraviolet light, a patterning process for directly patterning in a specified atmosphere by charged particle beams, a process for depositing a thin film in a pattern by irradiating energy beams such as ultraviolet light or electron beams in a pattern while supplying a specified reactive gas, or a process of diffusing atoms in a pattern. In addition, gases can be changed and combined, and the process can be made while the processing state of the surface of the substrate is measured. Moreover, another process may be used to measure and analyze the surface of the substrate.

Since the process chambers 2, capable of applying various processes, are disposed around the transport chamber 1 by way of the interface means 3 of the present invention, a substrate can be smoothly transported between the process chambers and then processed without any contamination of the atmosphere and the substrate while the different atmospheric conditions of the process chambers and the transport chamber are kept as they are. In particular, since the substrate can be transported without any change in the atmospheric conditions of the process chambers and the transport chamber, it becomes possible to eliminate the time required for the exhaust and pressure-setting for equalizing the atmospheric conditions of the chambers from and to which the substrate is transported. As a result, the throughput is improved and the contamination of the substrate is reduced; accordingly, the semiconductor device having a high performance can be manufactured at a high yield. Moreover, the reduction in the contamination of the substrate decreases the number of the cleaning process steps, which reduces the number of the process steps of the semiconductor device, thereby further improving the throughput.

The substrate 4 is fixed on the transfer means 5 by an electrostatic chuck provided on the recessed bottom of the transfer means 5. A guide means (not shown) is used for moving the transfer means 5 while keeping the micro-gap in the communicating corridor 8. The guide means may include the known rolling guide mechanism, a magnetic floating guide mechanism of keeping the distance by the repulsion of the magnetic force, a supporting mechanism of controlling the posture of the transport arm by a drive means, and the above mechanism combined with a link mechanism.

The exhaust means in the number of one or more are independently provided with exhaust holes connected to exhaust pumps. The structure and the number of the exhaust means are not limited to those in this embodiment, and they may be suitably selected according to the pressure difference between adjacent chambers, the size of the conductance part formed of a gap, the exhaust capacity of the exhaust pump and the like. The shutoff means 17 in the communicating corridor 8 may be provided not only at the communicating corridor outlet but also at the communicating corridor inlet.

The position of the transfer means 5 in the communicating corridor 8 can be measured by a noncontact positioning sensor suitably provided in the communicating corridor 8 or a dividing scale provided on the drive means 6. The timing of the opening/closing control for each shutoff means is easily controlled on the basis of the positional information of the transfer means 5 in the communicating corridor 8, and it can be also controlled according to the output of a pressure gauge suitable provided in the communicating corridor 8.

A second embodiment of the present invention will be described with reference to FIGS. 4a and 4b.

Figure 4A:
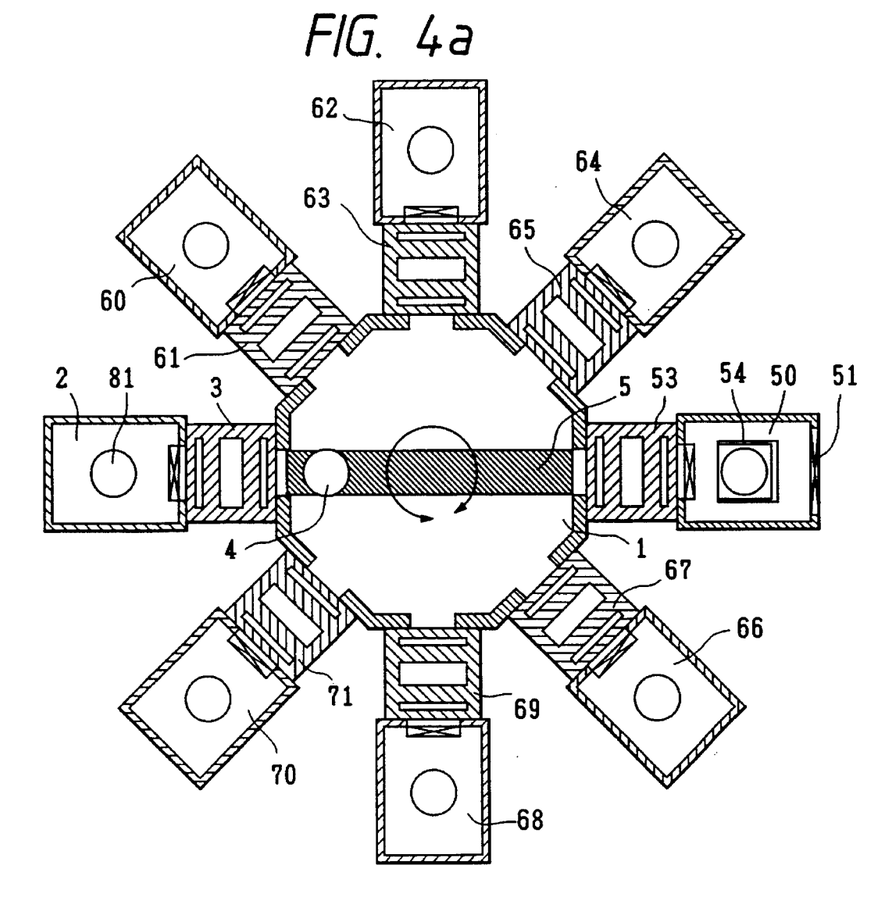
FIG. 4a is a plan view of a semiconductor process equipment used in a second embodiment of the present invention.
Figure 4B:
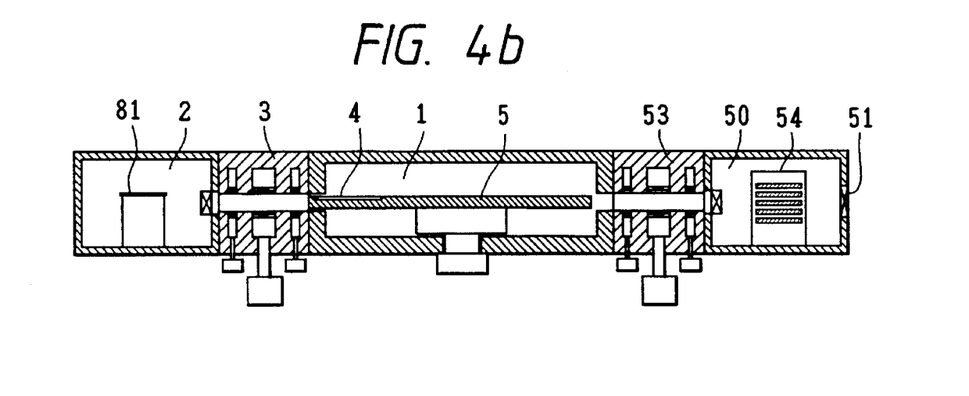
FIG. 4b is a side view of the semiconductor process equipment used in the second embodiment of the present invention.

FIG. 4a is a plan view of a multichamber processing equipment including eight interface means each having the same structure as in the first embodiment; and FIG. 4b is a side view of this equipment. Process chambers 2, 60, 62, 64, a load-lock chamber 50, process chambers 66, 68 and 70 are connected to a transport chamber 1 including a transfer means 5 having the rotating and linearly moving function by way of interface means 3, 61, 63, 65, 53, 67, 69 and 71. One or a plurality of substrates are supplied from the outside into the load-lock chamber 50 by means of a transport means (not shown) by way of a shutoff valve 51, and are mounted on a cassette 54. They wait to be transported to each process chamber by the transfer means 5. On the contrary, the substrates already processed in process chambers may be laminated on the cassette 54 and transported to the outside by way of the shutoff valve 51. The atmospheric condition in the load-lock chamber 50 is the same as that in the outside, and the substrates may be freely loaded from and unloaded to the outside. The substrate 4 transported in the load-lock chamber by the transfer means 5 while keeping the atmospheric pressure in the load-lock chamber is, for example, replaced by a substrate 81 already processed in the process chamber 2.

Various processes are performed in the process chambers 2, 60, 62, 64, 66, 68 and 70: aluminum sputtering (process chamber 2); tungsten sputtering (process chamber 60); degassing for removing the unnecessary gas component absorbed on the surface of the substrate (process chamber 62): oxide film etching (process chamber 64); metal film etching (process chamber 66): ashing (process chamber 68); and etching (process chamber 70). The substrate can be of course transported between the transport chamber and each process chamber while independently keeping the atmospheric condition of each process chamber. Moreover, the substrate can be transported therebetween while independently controlling the atmospheric condition of each process chamber.

A third embodiment of the present invention will be described with reference to FIGS. 5a to 5e.

When a transfer means 101 is returned from a communicating corridor of an interface means 3 into a transport chamber 1 and is rotated in the transport chamber 1, a process chamber 102 is shut-off from the communicating corridor by means of a communicating corridor shutoff means 100. The communicating corridor shutoff means 100 has a connecting means 106 for connecting to the transfer means 101 so that the corridor shutoff means 100 can be moved in interlock with the movement of the transfer means 101 in the communicating corridor. The sectional shape of the communicating corridor shutoff means 100 in the communicating corridor is substantially the same as that of the transfer means, so that the small conductance part is formed of a gap of 100 μm or less between the inner wall of the communicating corridor and the outer wall of the communicating corridor shutoff means. The other end of the communicating corridor shutoff means 100 has a shutoff mechanism 103 for shutting-off the outlet of the communicating corridor. A guide means 105 for accurately guiding the communicating corridor shutoff means 100 and the transfer means 101 is provided in the communicating corridor. In addition, a space 104 into which the communicating corridor shutoff means 100 escapes is provided in the process chamber 102.

Figure 5A:
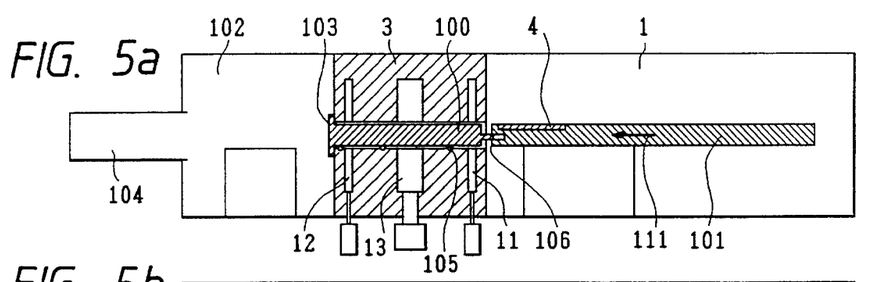
FIGS. 5a to 5e are schematic sectional views of a semiconductor process equipment showing the procedure of a third embodiment of the present invention.
Figure 5B:
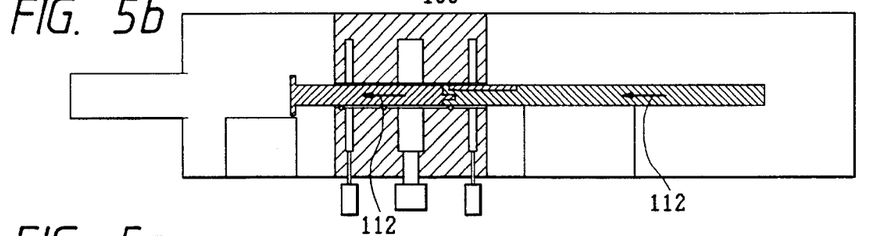
Figure 5C:
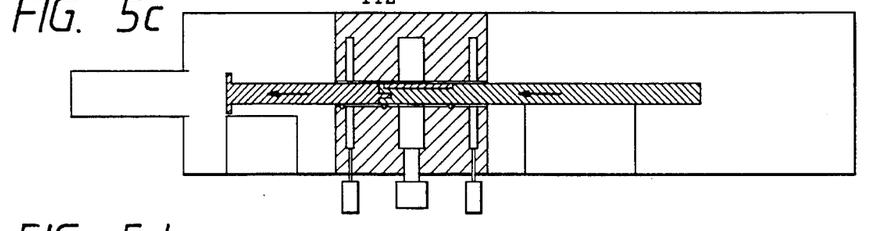
Figure 5D:
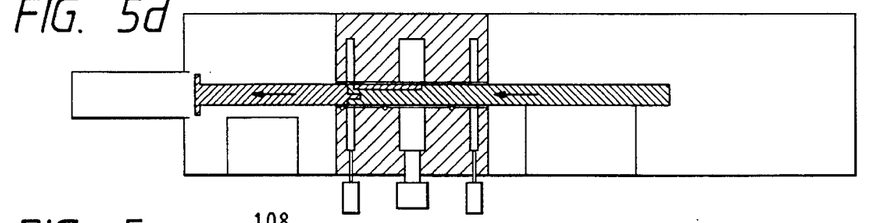
Figure 5E:
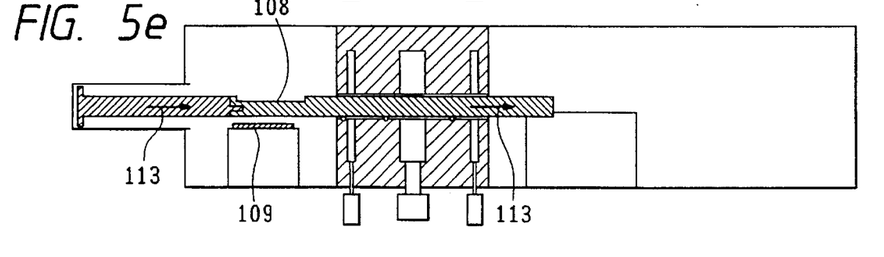

The procedure of transporting the substrate 4 will be briefly described below with reference to FIGS. 5a to 5e. In this example, the transfer means 101 loads the substrate 4 from another process chamber (not shown) into the transport chamber, being rotated and positioned oppositely to the process chamber 102, and transports the substrate into the process chamber 102. The communicating corridor shutoff means 100 is fed in the communicating corridor, and the communicating corridor outlet is closed by the shutoff mechanism 103. First, an exhaust means 13 is operated and then supply means 11 and 12 are operated, so that the conductance part in the communicating corridor is kept to be divided into a region filled with the atmospheric gas being the same as that in the transport chamber 1 and a region filled with the atmospheric gas being the same as that in the process chamber 102. Then, the transfer means 101 mounting the substrate 4 is moved in the direction of the arrow 111, and is connected to the communicating corridor shutoff means 100, which is stopped in the communicating corridor, by way of the connecting means 106 (see FIG. 5a). After that, the communicating corridor shutoff means 100 and the transfer means 101 are moved in an interlocked fashion with each other to the process chamber in the direction of the arrow 112, and the shutoff mechanism 103 is gradually opened on the side of the process chamber (see FIG. 5b). They are further moved (FIG. 5c), and the substrate is put in the process chamber (FIG. 5d). The substrate 109 is unloaded from a substrate mounting region 108 on the transfer means by a load-unload means (not shown) in the process chamber, and is disposed on a stage means. The communicating corridor shutoff means 100 and the transfer means 101 are then moved in interlock with each other in the direction of the arrow 113, and returned in the transport chamber (FIG. 5e). In addition, the returning into the transport chamber can be achieved in the manner reversed to the above procedure, and after the connecting means is separated, the transfer means 101 is rotated in the transport chamber to transport the substrate into another process chamber. The gas flow in the conductance part within the communicating corridor is adjusted by closing the supply means 12 after the shut-off of the communicating corridor outlet by the shutoff mechanism 103, closing the exhaust means 13, and finally closing the supply means 11. In addition, only by operating the supply means 11, the contamination in the communicating corridor can be prevented. Moreover, the method using the communicating corridor shutoff means 100 is effective to extremely shorten the time required for the exhaust and supply of the gas in the communicating corridor, and to reduce the amount of the gas used.

The functions and the number of the process chambers in the above-described multichamber processing equipment are not limited to those shown in this embodiment, and it is possible to provide process chambers for performing processes necessary for satisfying the functions of a semiconductor device such as thin film deposition, cleaning, and formation of a latent image. Moreover, the load-lock chamber for loading/unloading a substrate from or to the outside is apparently regarded as one process chamber. When the process is performed by sequentially changing the kind, composition, and pressure of gases in one process chamber, a supply gas supplied from a second supply means upon transporting the substrate from the transport chamber to the process chamber is desirable to be the same in quality or kind as the gas under the initial process condition of gases sequentially changed in the process chamber. In addition, the gases of the same kind mean, when a mixture gas is used for the surface treatment in the process chamber, the mixture gases having different mixture ratio.

The mixture gas used in this embodiment may include a mixture gas of $CF_4$ and $O_2$, a mixture gas of $CCl_4$ and $O_2$, and a mixture gas of $SF_6$ and $C_2ClF_5$ used for etching of Si; a mixture gas of $CF_4$ and $H_2$ used for etching of $SiO_2$; and a mixture gas of $BCl_3$, $Cl_2$ and $CF_4$ used for etching of Al. The gases having the same quality mean the gases which have the same composition but are different in the supply flow rate and back pressure. The supply flow rate and the back pressure are finely controlled to be set at the most effective values upon processing in the process chamber and operating in the transport chamber.

As described above, according to the embodiments of the present invention, a substrate can be transported at a high throughput between respective process chambers without any leak of the atmospheric gas between the mutual chambers and the generation of the contamination of the substrate while keeping the different atmospheric conditions of the process chambers. Moreover, after the insertion of the substrate, a semiconductor device having a high performance is manufactured, and fed only by this method, so that a process environment facility such as a high clean room is not particularly required, and further the interface means can be standardized and shared, thus making it possible to easily provide a semiconductor device with a high performance at a low cost. Therefore, according to the present invention, it becomes possible to reduce the contamination of the semiconductor device generated by the transporting of the wafer as compared with the conventional one.

What is claimed is:

1. A wafer transport method comprising the steps of:

preparing a semiconductor process equipment, said equipment including a process chamber, a transport chamber for transporting a semiconductor wafer to said process chamber, an interface means disposed between said process chamber and said transport chamber, and a transport means for transporting said wafer from said transport chamber to said process chamber by way of said interface means, wherein said interface means is provided with a communicating corridor capable of inserting and pushing said transport means from the side of said transport chamber for allowing said transport means to penetrate into said process chamber;

inserting said transport means mounting said wafer into said communicating corridor, and when the leading edge of said transport means is positioned in front of the opening of a first supply means connected to said communicating corridor, starting the supply of a first gas from said first supply means into said communicating corridor;

increasing the insertion amount of said transport means in said communicating corridor, and when the leading edge of said transport means passes through the opening of said first supply means, starting the exhaust of the gas in said communicating corridor by an exhaust means connected to said communicating corridor while continuing the supply of said first gas;

further increasing the insertion amount of said transport means in said communicating corridor, and when the leading edge of said transport means passes through the opening of said exhaust means, starting the supply of a second gas from a second supply means connected to said communicating corridor into said communicating corridor while continuing the supply of said first gas and also continuing the exhaust by said exhaust means;

further increasing the insertion amount of said transport means into said communicating corridor, and when the leading edge of said transport means passes through the opening of said second supply means, opening the space between said communicating corridor and said process chamber which is shut-off by a shutoff means while continuing the supply of said first and second gases and also continuing the exhaust by said exhaust means; and further increasing the insertion amount of said transport means into said communicating corridor, thereby transporting said wafer into said process chamber.

2. A wafer transport method according to claim 1, wherein said process chamber is adapted to apply a surface treatment to said semiconductor wafer.

3. A wafer transport method according to claim 2, wherein said surface treatment comprises at least one kind selected from a group consisting of an etching process, a cleaning process, an ashing process, a thin film deposition process, a lithography process, an electron beam lithography process and a surface measurement process.

4. A wafer transport method according to claim 1, wherein the sectional shape of said transport means at its portion inserted in said communicating corridor is substantially analogous to the sectional shape of said communicating corridor.

5. A wafer transport method according to claim 1, wherein a stage of wafer is provided on a front portion of said transport means.

6. A wafer transport method according to claim 1, wherein the sectional shape of said communicating corridor is substantially analogous to the sectional shape of said transport means so that said wafer can be transported into said process chamber by inserting and pushing said transport means mounting said wafer from the side of said transport chamber.

7. A wafer transport method according to claim 6, wherein a gap between said communicating corridor and said transport means inserted in said communicating corridor is kept to be small, so that said gap forms a small conductance part.

8. A wafer transport method according to claim 1, wherein said first supply means is connected to said communicating corridor on the side near said transport chamber; said second supply means is connected to said communicating corridor on the side near said process chamber; an exhaust means connected to said communicating corridor is provided between said first supply means and said second supply means; and a shutoff means for shut-off of said communicating corridor is provided in said communicating corridor near the end portion thereof on the side of said process chamber.

9. A wafer transport method according to claim 1, wherein prior to the insertion of said transport means in said communicating corridor, said communicating corridor is shut-off by said shutoff means, the supply of gases from said first and second supply means, and the exhaust function of said exhaust means is stopped.

10. A wafer transport method according to claim 1, wherein said first gas is the same in quality or kind as the gas in said transport chamber, and the gas pressure of said first gas is higher than that of the gas in said transport chamber.

11. A wafer transport method according to claim 1, wherein said second gas is the same in quality or kind as the gas in said process chamber, and the gas pressure of said second gas is higher than that of the gas in said process chamber.

12. A wafer transport method according to claim 1, wherein the pressure in said process chamber is higher or lower than that in the transport chamber.

13. A wafer transport method according to claim 1, a gap formed between the wall surface of said communicating corridor and the wall surface of said transport means inserted in said communicating corridor is set at a finite value being 100 µm or less, and a conductance part is formed of said gap.

14. A wafer transport method according to claim 1, further comprising the steps of:

mounting said wafer from a stage means in said process chamber onto said transport means which is inserted in said communicating corridor and is introduced at the leading edge in said process chamber;

retreating said transport means, and when the end portion of said transport means is retreated behind the position of said shutoff means, shutting-off the space between said communicating corridor and said process chamber by said shutoff means;

further retreating said transport means, and when the end portion of said transport is retreated behind the position of said second supply means, stopping the supply of said second gas from said second supply means; and further retreating said transport means, and when the end portion of said transport means is retreated behind the position of said first supply means, stopping the supply of said first gas from said first supply means.

15. A wafer transport method according to claim 1, wherein said semiconductor process equipment has first and second process chambers and first and second interface means for one transport chamber, wherein said first interface means is provided between said transport chamber and said first process chamber, and said second interface means is provided between said transport chamber and said second process chamber.

16. A wafer transport method according to claim 15, wherein said first process chamber and said second process chamber are adapted to apply different surface treatments to said wafer therein, and said wafer after being applied with a first surface treatment in said first process chamber is returned in said transport chamber, and is then transported into said second process chamber by way of said second interface means.

17. A wafer transport method comprising the steps of:

preparing a semiconductor process equipment, said equipment including a process chamber for applying a surface treatment to a semiconductor wafer, a transport chamber for transporting said wafer to said process chamber, an interface means disposed between said process chamber and said transport chamber, and a transport means for transporting said wafer from said transport chamber to said process chamber by way of said interface means, wherein said transport means has a stage of wafer at the front portion thereof, said interface means is provided with a communicating corridor having the sectional shape being substantially analogous to that of said transport means so that said wafer can be transported in said process chamber by inserting and pushing said transport means mounting said wafer from the side of said transport chamber, a gap between said communicating corridor and said transport means inserted in said communicating corridor is kept to be small so that it forms a small conductance part, a first supply means is connected to said communicating corridor on the side near said transport chamber, a second supply means is connected to said communicating corridor on the side near said process chamber, an exhaust means connected to said communicating corridor is provided between said first supply means and said second supply means, and a shutoff means for shut-off of said communicating corridor is provided in said communicating corridor near the end portion thereof on the side of said process chamber;

shutting-off said communicating corridor by said shutoff means, and inserting said transport means mounting said wafer from the side of said transport chamber in such a state that the supply of gases from said first and second supply means is stopped and the exhaust function of said exhaust means is stopped;

increasing the insertion amount of said transport means in said communicating corridor, and when the leading edge of said transport means is positioned in front of the opening of said first supply means, starting the supply of a first gas being the same in quality or kind as the gas in said transport chamber to said communicating corridor from said first supply means;

further increasing the insertion amount of said transport means in said communicating corridor, and when the leading edge of said transport means passes through the opening of said first supply means, starting the exhaust in said communicating corridor by said exhaust means while continuing the supply of said first gas;

further increasing the insertion amount of said transport means in said communicating corridor, and when the leading edge of said transport means passes through the opening of said exhaust means, starting the supply of a second gas being the same in quality or kind as the gas in said process chamber to said communicating corridor from said second supply means while continuing the supply of said first gas and also continuing the exhaust by said exhaust means;

further increasing the insertion amount of said transport means in said communicating corridor, and when the leading edge of said transport means passes through the opening of said second supply means, opening said communicating corridor which is shut-off by said shutoff means while continuing the supply of said first and second gases and also continuing the exhaust by said exhaust means; and further increasing the insertion amount of said transport means in said communicating corridor in such a state, thereby transporting said wafer in said process chamber.

18. A wafer transport method according to claim 17, wherein said first gas is the same as that in said transport chamber, and said second gas is the same as that in said process chamber.

19. A wafer transport method according to claim 17, wherein said exhaust means has at least a first exhaust means and a second exhaust means which are disposed between said first supply means and said second supply means.

20. A wafer transport method comprising the steps of:

preparing a semiconductor process equipment, said equipment including a process chamber for applying a surface treatment to a semiconductor wafer, a transport chamber for transporting said wafer to said process chamber, an interface means disposed between said process chamber and said transport chamber, and a first transport means and a second transport means for transporting said wafer from said transport chamber to said process chamber by way of said interface means, wherein a connecting means for connecting said first transport means to said second transport means is provided at one end of said first transport means, a shutoff means for shut-off of the end portion of said communicating corridor on the side of said process chamber is provided on the other end of said first transport means, a holding means for holding said wafer is provided on said second transport means on the side to be connected to said first transport means, an interface means is provided with a communicating corridor having the sectional shape being substantially analogous to that of said first and second transport means so that said wafer can be transported in said process chamber by inserting and pushing said first transport means and said second transport means mounting said wafer from the side of said transport chamber, a gap between said communicating corridor and said first and second transport means inserted in said communicating corridor is kept to be small so that it forms a conductance part, a first supply means is connected to said communicating corridor on the side near said transport chamber, a second supply means is connected to said communicating means on the side near said process chamber, and an exhaust means connected to said communicating corridor is provided between said first supply means and said second supply means;

inserting said first transport means in said communicating corridor and shutting-off said communicating corridor by said shutoff means, starting the exhaust in said communicating corridor by said exhaust means, starting the supply of a first gas being substantially the same in quality and kind as that in said transport chamber to said communicating corridor from said first supply means, and starting the supply of a second gas being substantially the same in quality or kind as that in said process chamber to said communicating corridor from said second supply means;

inserting said second transport means mounting said wafer from the side of said transport chamber and connecting said second transport means to said first transport means by said connecting means; and further increasing the insertion amount of said second transport means in said communicating corridor in such a state thereby transporting said wafer in said process chamber.

21. A wafer transport method according to claim 20, wherein said wafer is mounted on said second transport means in such a state that said first transport means is connected to said second transport means, and that the portion of said second transport means mounting said wafer is transported in said process chamber;

said first and second transport means are retreated and the end portion of said communicating corridor on the side of said process chamber is shut-off by said shutoff means; and said second transport means is further retreated and the connection between said first transport means and said second transport means is released, the supply of said second gas from said second supply means is stopped, and the exhaust by said exhaust means is stopped.

* * * * *